United States Patent
Kitahara (10) Patent No.: US 6,915,497 B2
(45) Date of Patent: Jul. 5, 2005

(54) AUTOMATIC DESIGN SYSTEM FOR WIRING ON LSI

(75) Inventor: Takeshi Kitahara, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/681,640

(22) Filed: Oct. 8, 2003

(65) Prior Publication Data

US 2004/0133867 A1 Jul. 8, 2004

(30) Foreign Application Priority Data

Oct. 10, 2002 (JP) ..................................... P2002-297793

(51) Int. Cl.$^7$ ............................................. G06F 17/50
(52) U.S. Cl. ........................................... 716/6; 716/10
(58) Field of Search ................................ 716/1–2, 4–6, 716/10–14

(56) References Cited

U.S. PATENT DOCUMENTS

| | | | | |
|---|---|---|---|---|
| 5,507,029 A | * | 4/1996 | Granato et al. | ................. 716/6 |
| 5,648,913 A | * | 7/1997 | Bennett et al. | ................. 716/6 |
| 6,272,667 B1 | | 8/2001 | Minami et al. | |
| 6,318,911 B1 | | 11/2001 | Kitahara | |
| 6,698,006 B1 | * | 2/2004 | Srinivasan et al. | ........... 716/10 |

OTHER PUBLICATIONS

Kitahara, et al., "A Clock–Gating Method for Low–Power LSI Design", *Proceedings Asia and South Pacific Design Automation Conference*, pp. 307–312 (Feb. 1998).

* cited by examiner

*Primary Examiner*—Vuthe Siek
*Assistant Examiner*—Paul Dinh
(74) *Attorney, Agent, or Firm*—Brenda O. Holmes; Kilpatrick Stockton LLP

(57) ABSTRACT

An automatic design system for designing wirings on circuit elements, includes an input device configured to receive circuit information, a glitch searching unit configured to search a glitch-occurring circuit element, a skew calculator configured to calculate a skew of a clock signal, a circuit information analyzer configured to define the calculated skew as a first target skew and determine whether the glitch can be reduced by setting the first target, a first target skew setting unit configured to set the first target, and a first latch insertion unit configured to insert a first latch.

2 Claims, 9 Drawing Sheets

FIG. 4D  OUTPUT
FIG. 4E  OUTPUT

AUTOMATIC DESIGN SYSTEM FOR WIRING ON LSI

CROSS REFERENCE TO RELATED APPLICATIONS

This application is based upon and claims the benefit of priority from the prior Japanese Patent Application No. P2002-297793, filed on Oct. 14, 2002; the entire contents of which are incorporated herein by reference.

BACKGROUND OF THE INVENTION

1. Field of the Invention

The present invention relates to an automatic design technology for an LSI by use of a computer.

2. Description of the Related Art

Semiconductor chips such as LSIs have tended to increase integration scales and sizes in recent years. Furthermore, clock frequencies supplied to those LSI circuits have been drastically enhanced. In this connection, power dissipation by a semiconductor chip is also increasing. For this reason, when an LSI circuit is loaded on a portable device using a battery as a power source, operating time of such a portable device per of the battery is decreased. Accordingly, reduction in power dissipation by the circuit is demanded.

One of methods for achieving reduction in power dissipation is to reduce glitches that occur in a circuit. A "glitch" refers to an electrical noise which is caused by switching. Electric power consumed by a glitch is only a waste of power; accordingly, it is desirable to minimize such glitches.

A method for reducing power dissipation attributable to glitches is to insert a latch into a combination circuit. In this method, even if a glitch is fed to a latch, the glitch does not appear in an output signal from the latch unless a clock signal is fed to the latch. Accordingly, the glitch can be excluded from the output signal from the latch. Eventually, it is possible to reduce power dissipation.

Another method for achieving reduction in power dissipation is the gated clock design. The gated clock design is a method for resolving a problem that power dissipation is considerably increased by supplying clock signals constantly to respective registers and therefore to the entire clock tree. According to the gated clock design, an enable circuit is insert between a clock and a register group. A clock signal is supplied to the register group only when a register-transfer condition is established while an output signal from the enable circuit has a certain value. In this event, an output signal from a logic circuit is received by the register group. According to the gated clock design, the register does not require a feedback loop for retaining a current value when the register-transfer condition is not established. Moreover, the frequency of the clock signals to be supplied to the register is reduced; accordingly, it is possible to reduce a frequency of the amplitude in the clock tree and thereby to reduce power dissipation.

Logic design occurs first in LSI design, then a placement process for respective gates is performed, and clock wiring is performed thereafter. Therefore, in the gated clock design as well, the logic design takes place first, then the placement process for respective gates corresponding to the logic design is performed, and a designing process for clock wiring to connect clock terminals of respective storage elements is performed thereafter. Here, the "storage elements" refer to all circuit elements capable of retaining values, for example, flip-flops (F/F), latches, and memories and the like. As one of the clock wiring processes, a clock tree synthesis (CTS) process may be used in order to minimize a clock skew. The CTS process is a process of wiring on latches mutually with the same wiring distances and in a bottom-up manner. The CTS processing equalizes propagation delays of clock signals reaching the respective clock terminals. As a result, it is possible to achieve clock wiring while minimizing the clock skew.

However, the method of insertion the latches into the combination circuits requires insert of the latches into all the portions intended to reduce glitches. Accordingly, the method has a problem that the area of a semiconductor chip such as an LSI is increased due to insertion of the latches. As a result, such an increase in the area constitutes an obstacle for achieving a reduction in power dissipation.

Figure 1:
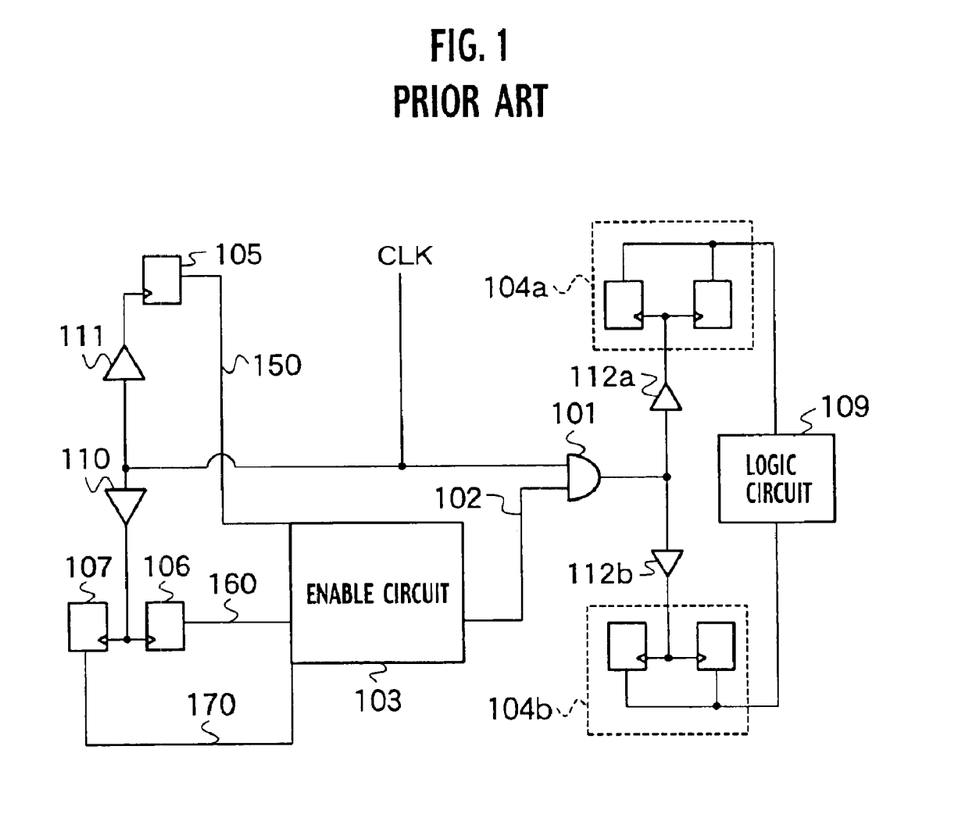
FIG. 1 is a view schematically showing the gated clock design.

Also, when the clock wiring is performed in the gated clock design by use of the CTS processing, it is possible that a timing constraint starting from the output signal from the F/F to the register group is not satisfied after the clock wiring. For example, consideration is given regarding a logic circuit adopting the gated clock design as shown in FIG. 1. Here, when a clock signal CLK is supplied to an enable circuit 103 through buffers 110 and 111, F/Fs 105 to 107, and wiring 150, 160 and 170, a register-transfer condition is established and an output signal from the enable circuit 103 is fed to an AND gate 101 through wiring 102, then the clock signal CLK is supplied from the AND gate 101 to register groups 104a and 104b through buffers 112a and 112b, and an output signal from a logic circuit 109 is received by the register groups 104a and 104b. Since the path delays starting from the F/Fs 105 to 107 to the output of the enable circuit 103 vary, it is possible that the timing constraints starting from the output signals from the F/Fs 105 to 107 to the register groups 104a and 104b are not satisfied after the clock wiring. Moreover, the buffers 112a and 112b may be added to an output destination of the AND gate 101, when the clock wiring is processed, in order to adjust a clock skew. In this case, propagation delays between the AND gate 101 and the register groups 104a and 104b are increased. Accordingly, a critical path not satisfying the timing constraint may be generated within the circuit in the region starting from the F/F 105 to 107 to the register groups 104a and 104b. In this case, it is necessary to return to the logic design and modify the logic design so as not to apply the gated clock design to the registers, and then to execute the placement process again. Such re-execution of the placement process incurs a problem of an increase in the designing time period.

SUMMARY OF THE INVENTION

An aspect of the present invention inheres in an automatic design system for designing wirings on circuit elements including an input device configured to receive circuit information on logic circuits scheduled to be layouted on a large-scale integrated circuit, a glitch searching unit configured to search a glitch-occurring circuit element in the logic circuits to which a glitch occurs, a skew calculator configured to calculate a skew of a clock signal to be fed to the glitch-occurring circuit element, a circuit information analyzer configured to define the calculated skew as a first target skew and determine whether the glitch can be reduced by setting the first target skew to a signal propagation path toward the glitch-occurring circuit, a first target skew setting unit configured to set the first target skew to the signal propagation path when the circuit information analyzer determines that the glitch can be reduced, and a first latch insertion unit configured to insert a first latch in a signal propagation path starting form an output side of a glitch-occurring circuit output side of the circuit element when the circuit information analyzer determines that the glitch cannot be reduced.

Another aspect of the present invention inheres in an automatic design system including an input device configured to receive circuit information on a logic circuit designed in accordance with a gated clock design and being scheduled to be layouted on a large-scale integrated circuit, a first timing verification unit configured to verify whether a timing constraint for allowing the logic circuit to operate normally is satisfied, a first clock wiring processing unit configured to perform clock wiring on the logic circuit on a semiconductor chip region in accordance with the gated clock design, a second timing verification unit configured to verify whether the logic circuit after the clock wiring satisfies the timing constraint, a slack value calculator configured to calculate the maximum slack value from of critical paths which do not satisfy the timing constraint when the second timing verification unit verifies that the timing constraint is not satisfied, and a target skew setting unit configured to set a target skew so as to render the slack value positive.

Still another aspect of the present invention inheres in a computer implemented wiring method for designing wirings on circuit elements concluding supplying circuit information on logic circuits scheduled to be layouted on a large-scale integrated circuit, searching a glitch-occurring circuit element on the logic circuits where a glitch occurs, calculating a skew of a clock signal to be fed to the glitch-occurring circuit element, analyzing whether the glitch can be reduced by setting the calculated skew as a first target skew to a signal propagation path toward the glitch-occurring circuit, setting the first target skew to the signal propagation path when a determination is made that the glitch can be reduced to the signal propagation path, and insert a first latch in a signal propagation path starting from an output side of the glitch-occurring circuit when it is determined that the glitch cannot be reduced.

Yet still another aspect of the present invention inheres in a computer implemented wiring method including supplying circuit information on logic circuits designed by a gated clock design and being scheduled to be layouted on a large scale integrated circuit, verifying whether a timing constraint for allowing the logic circuit to operate normally is satisfied, performing clock wiring on the logic circuits, verifying whether the logic circuits after the clock wiring satisfies the timing constraint, calculating the maximum slack value out of critical paths which do not satisfy the timing constraint when the timing constraint is not satisfied, and setting a target skew so as to render the slack value positive.

DETAILED DESCRIPTION OF EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set forth such as specific signal values, etc. to provide a thorough understanding of the present invention. However, it will be obvious to those skilled in the art that the present invention may be practiced without such specific details. In other instances, well-known circuits have been shown in block diagram forms in order not to obscure the present invention in unnecessary detail.

(First Embodiment)

Figure 2:
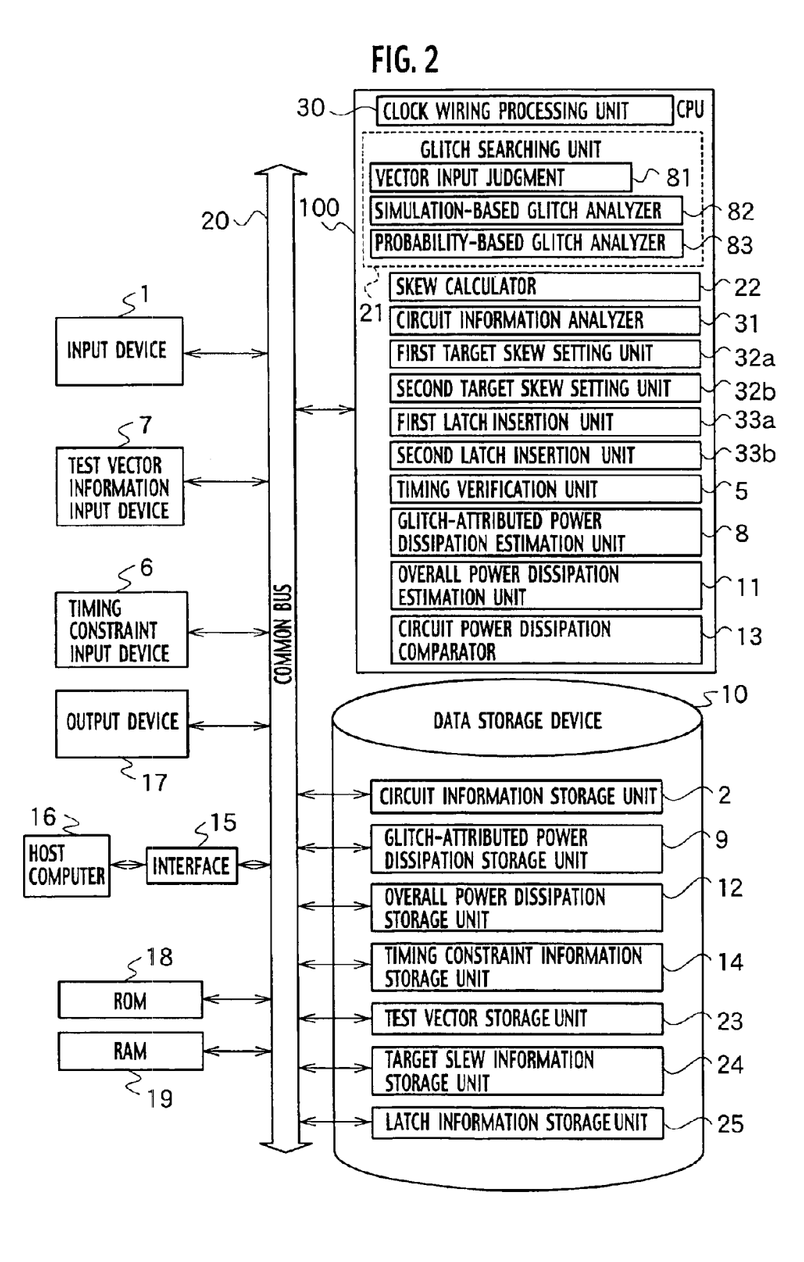
FIG. 2 is a view schematically showing an automatic design system according to a first embodiment of the present invention.

As shown in FIG. 2, an automatic design system according to a first embodiment of the present invention includes an input device 1, a test vector information input device 7, a timing constraint input device 6, a central processing unit (CPU) 100, an output device 17, an interface 15, a host computer 16, a common bus 20, a read-only memory (ROM) 18, a random access memory (RAM) 19, and a data storage device 10. The data storage device 10 includes files such as a circuit information storage unit 2, a test vector information storage unit 23, a timing constraint information storage unit 14, a glitch-attributed power dissipation storage unit 9, an overall power dissipation storage unit 12, a target skew information storage unit 24, and a latch information storage unit 25.

Circuit information on a logic circuit to be designed is supplied to the data storage device 10 by the input device 1. In the case of setting a test vector, test vector information is supplied to the data storage device 10 by the test vector information input device 7. Timing constraint information to be satisfied by the logic circuit is supplied to the data storage device 10 by the timing constraint input device 6. For example, clock cycles, clock frequencies, set-up/hold time, and the like are supplied by the timing constraint input device 6. The output device 17 provides data to be processed by the CPU 100. The host computer 16 saves data, which are similar to the data provided from the output device 17, in a hard disk or the like through the interface 15, and provides the data to a monitor or the like which is connected to the host computer 16. The input device 1, the test vector information input device 7, the timing constraint input device 6, the CPU 100, the output device 17, the interface 15, and the data storage device 10 mutually exchange the data via the common bus 20.

Moreover, the CPU 100 includes a clock wiring processing unit 30, a glitch searching unit 21, a skew calculator 22, a circuit information analyzer 31, a first target skew setting unit 32a, a second target skew setting unit 32b, a first latch insertion unit 33a, a second latch insertion unit 33b, a timing verification unit 5, a glitch-attributed power dissipation estimation unit 8, an overall power dissipation estimation unit 11, and a circuit power dissipation comparator 13. The glitch searching unit 21 searches a glitch-occurring circuit element in the logic circuit where a glitch occurs. If the test vector information is supplied, the glitch searching unit 21 can search the glitch-occurring circuit element by means of simulation. Even if the test vector information is not supplied, the glitch searching unit 21 can search the glitch-occurring circuit element, depending on the type of the circuit element and by means of calculating propagation delays which occur in the wiring, the circuit element, or the like. The skew calculator 22 calculates a skew of a signal to be fed to the circuit element searched by the glitch searching unit 21. The skew is calculated by calculating the propagation delays which occur in the wiring, the circuit element, or the like.

Figure 3A:
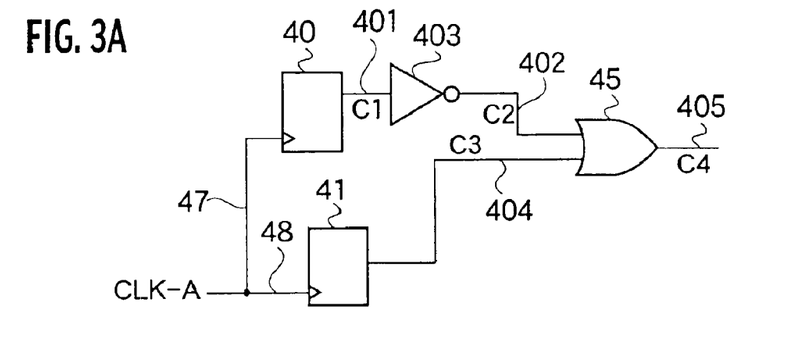
FIG. 3A is a view schematically showing the logic circuit where a glitch occurs.
Figure 3B:
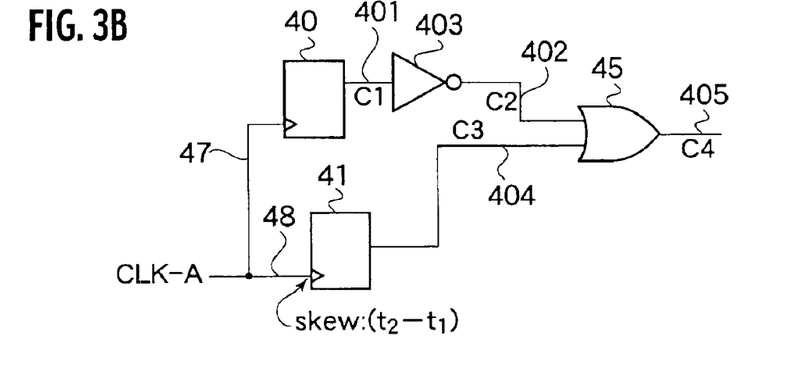
FIG. 3B is a view schematically showing the logic circuit where a skew is set.
Figures 3C, 3D:
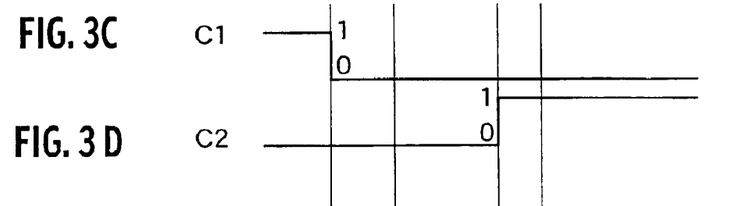
FIG. 3C is a time chart showing an output signal C1.
FIG. 3D is a time chart showing an output signal C2.
Figures 3E, 3F:
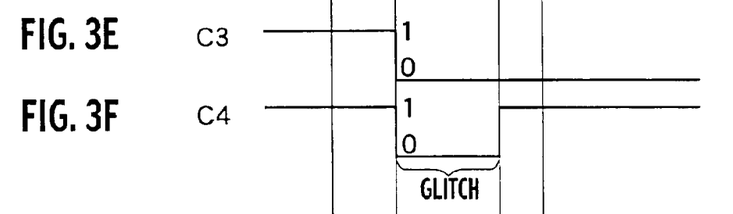
FIG. 3E is a time chart showing an output signal C3.
FIG. 3F is a time chart showing an output signal C4.
Figure 3G:
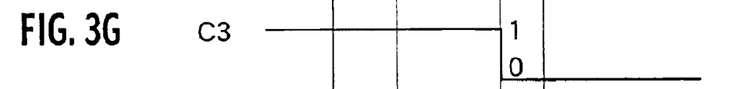
FIG. 3G is a time chart showing the output signal C3 after setting the skew.
Figure 3H:
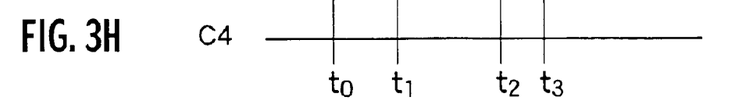
FIG. 3H is a time chart showing the output signal C4 after setting the skew.

The circuit information analyzer 31 defines the skew calculated by the skew calculator 22 as a first target skew and determines whether the glitch can be reduced by setting the first target skew to a signal propagation path toward the glitch-occurring circuit. For example, consideration is given regarding a logic circuit as shown in FIG. 3A. Here, when a clock signal CLK-A is supplied to a F/F 40 through wiring 47 and F/F 41 through wiring 48. The F/F 40 supplies an output signal C1 to an inverter 403 through wiring 401. The inverter 403 supplies an output signal C2 to an OR gate 45 through wiring 402. The F/F 41 supplies an output signal C3 to the OR gate 45 through wiring 404. The OR gate 45 supplies an output signal C4. In this case, as shown in a time chart of FIG. 3C, the output signal C1 changes from 1 to 0 at a time point $t_0$. Then as shown in a time chart of FIG. 3D, the output signal C2 fed to the OR gate 45 changes from 0 to 1 at a time point $t_2$. As shown in a time chart of FIG. 3E, the output signal C3 fed to the OR gate 45 changes from 1 to 0 at a time point $t_1$. As shown in a time chart of FIG. 3F, the output signal C4 supplied from the OR gate 45 changes from 1 to 0 at the time point $t_1$, and changes from 0 to 1 at the time point $t_2$. Therefore a glitch is thereby generated on the output signal C4. As shown in a time chart of FIG. 3B, the first target skew setting unit 32a sets the skew value $t_2-t_1$ to the wiring 48. As shown in a time chart of FIG. 3G, the output signal C3 is fed to the OR gate 45 with propagation delay. Therefore the output signal C3 changes from 1 to 0 at the point time $t_2$. Accordingly, as shown in a time chart of FIG. 3H, a glitch is not thereby generated on the output signal C4 supplied from the OR gate 45. In this case, the circuit information analyzer 31 determines that the glitch can be reduced by setting the first target skew.

Figure 4A:
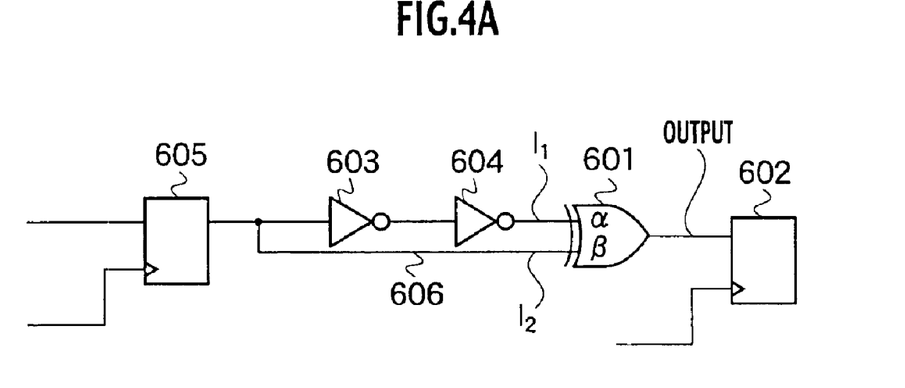
FIG. 4A is a diagram of a circuit that can reduce a glitch by insert a latch.
Figure 4B:
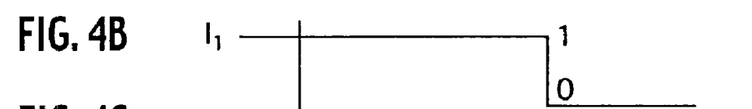
FIG. 4B is a time chart showing an output signal $I_1$.
Figure 4C:
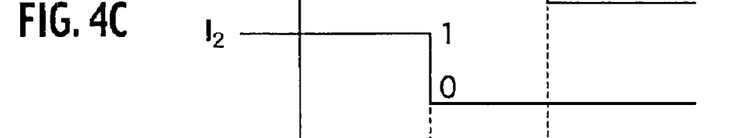
FIG. 4C is a time chart showing an output signal $I_2$.
Figures 4D, 4E:
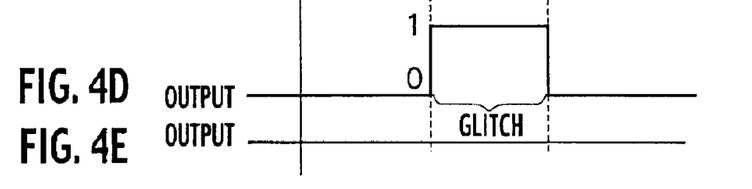
FIG. 4D is a time chart showing an output signal of a glitch-occurring circuit element.
FIG. 4E is a time chart showing an output signal of a latch inserted in a signal propagation path starting from an output side of the glitch-occurring circuit.

However, depending on the type of logic circuit, there may be a case where the circuit information analyzer 31 determines that a glitch cannot be reduced even if the first target skew is set. For example, in a logic circuit as shown in FIG. 4A, an output signal from a F/F 605 propagates through a path (a first path) which passes through inverters 603 and 604 and reaches a terminal α of an EXOR gate 601, and through a path (a second path) which passes through wiring 606 and reaches a terminal β of the EXOR gate 601. In this case, as shown in a time chart of FIGS. 4B and 4C, a difference in propagation delay is created between the signals ($I_1$, $I_2$) which propagate through the first path and the second path and are fed to the terminal α and the terminal β of the EXOR gate 601. Therefore a glitch is thereby generated on an output signal supplied from the EXOR gate 601 as shown in a time chart of FIG. 4D. However, even if the skew is adjusted by setting the first target skew input side of the F/F 605, the difference in propagation delay between the signals $I_1$ and $I_2$ is not reduced to 0. Accordingly, it is not possible to reduce a glitch which is generated output side of the EXOR gate 601. In this case, the glitch can be reduced as shown in a time chart FIG. 4E if a first latch 602 is insert output side of the EXOR gate 601 as shown in FIG. 4A. Even if the glitch is fed to the latch 602, the latch 602 holds an output signal until a next clock signal is fed to the latch 602. In this case, the circuit information analyzer 31 determines that the glitch cannot be reduced by setting the first target skew.

The first target skew setting unit 32a calculates and sets the first target skew when the circuit information analyzer 31 determines that the glitch can be reduced by setting the first target skew.

When the timing verification unit 5 verifies that the timing constraint fed by the timing constraint input device 6 is not satisfied, the second target skew setting unit 32b sets a second target skew on the clock wiring so as to satisfy this timing constraint. When the circuit information analyzer 31 determines that the glitch can not be reduced by setting the first target skew, the first latch insertion unit 33a insert a first latch in a signal propagation path starting from an output side of the glitch-occurring circuit searched by the glitch searching unit 21. When the timing verification unit 5 verifies that the timing constraint supplied by the timing constraint input device 6 is not satisfied, the second latch insertion unit 33b insert a second latch in the signal propagation path starting from an output side of the circuit element so as to satisfy this timing constraint. After clock wiring is performed on the logic circuit where the first target skew is set by the first target skew setting unit 32a, or on the logic circuit where the first latch is insert by the first latch insertion unit 33a, the timing verification unit 5 verifies whether the timing constraint supplied by the timing constraint input device 6 is satisfied. In general, a static timing analysis (STA) is adopted as a verification method. The glitch-attributed power dissipation estimation unit 8 calculates electric power to be consumed by the glitch which occurs in the circuit element searched by the glitch searching unit 21. The power dissipation by the glitch can be found by multiplication of a frequency of occurrence of the glitch and a quantity of power dissipation per glitch. The frequency of occurrence of the glitch and the circuit element where the glitch occurs are determined by the glitch searching unit 21. The quantity of power dissipation W per glitch is found as follows. The power dissipation W consists of power dissipation WI inside the gate and power dissipation WO of external wiring.

$$W=WI+WO \quad (1)$$

The value WI is obtained by measurement. The value WO is calculated by the following formula:

$$WO=CV^2f/2 \quad (2)$$

where C is a wiring capacity, V is a voltage at a power source, and f is the frequency of occurrence of the glitch.

The overall power dissipation estimation unit 11 calculates overall power dissipation attributed to the logic circuit subjected to clock wiring by the clock wiring processing unit 30 and the logic circuit, supplied by the input device 1. The circuit power dissipation comparator 13 compares increases and decreases in the power dissipation attributed to the glitch calculated by the glitch-attributed power dissipation estimation unit 8 and in the overall power dissipation attributed to the logic circuit calculated by the overall power dissipation estimation unit 11 before and after setting the first target skew or the second target skew and insertion of the first latch or the second latch. In other words, the circuit power dissipation comparator 13 compares the glitch attributed power dissipation which is decreased by setting the first target skew or the second target skew or by insertion of the first latch or the second latch, with the overall power dissipation attributed to the logic circuit which is increased by insertion of the buffers, adjustment of the clock wiring, and/or insertion of the latches.

The glitch searching unit 21 includes a test vector input judgment unit 81, a simulation-based glitch analyzer 82, and a probability-based glitch analyzer 83. The test vector input judgment unit 81 judges whether the test vector information is supplied by the test vector information input device 7. When the test vector input judgment unit 81 judges that the test vector information has been supplied, the simulation-based glitch analyzer 82 performs simulation of the logic circuit based on the supplied test vector information while adopting information such as the propagation delays generated in the wiring, the circuit elements or the like. To be more precise, the frequency of occurrence of the glitch is determined by the time chart based on an input pattern and the propagation delays of the signals which occur in the wiring, the circuit elements or the like, and the circuit element where the glitch occurs is thereby determined. When the test vector input judgment unit 81 judges that the test vector information has not been supplied, the probability-based glitch analyzer 83 finds the frequency of occurrence of the possibility of a glitch as a possibility by use of a probability calculation, and thereby determines the circuit element where the glitch occurs.

Figure 5A:
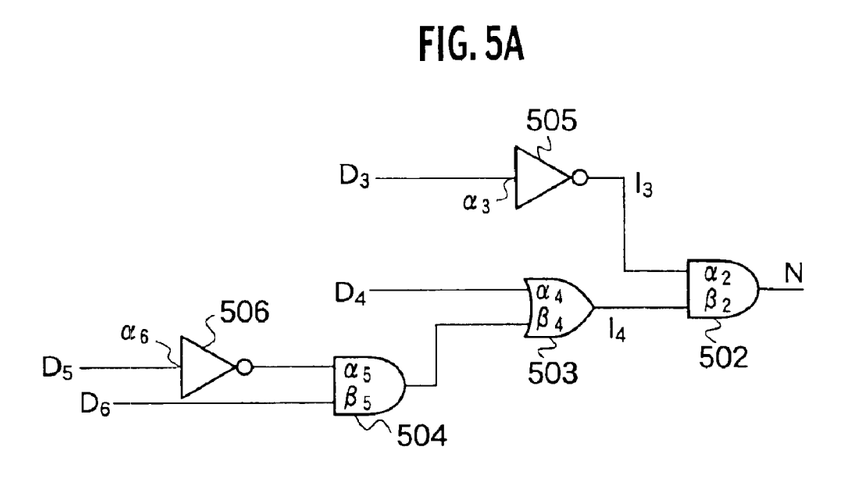
FIG. 5A is a circuit diagram for explaining a mode of finding a frequency of occurrence of a glitch as a probability.

For example, consideration will be given to a logic circuit as shown in FIG. 5A. There are four possible combinations to be adopted by inputs ($I_3$, $I_4$) of an AND gate 502, namely, (0, 0), (0, 1), (1, 0), and (1, 1). Of these there are three combinations, the combinations which satisfy an output N of the AND gate 502 being equal to 0, i.e., (0, 0), (0, 1), and (1, 0). Therefore, a probability P(N=0) to satisfy the output N being equal to 0 is calculated as follows:

$$P(N=0)=P(I_3=0)P(I_4=0)+P(I_3=0)P(I_4=1)+P(I_3=1)P(I_4=0) \quad (3)$$

Similarly, a probability P(N=1) to satisfy the output N being equal to 1 is calculated as follows:

$$P(N=1)=P(I_3=1)P(I_4=1) \quad (4)$$

As a result, a probability P(N: 0→1) where the output N changes from 0 to 1 is expressed by multiplication of the probability where N=0 before the change and the probability where N=1 after the change, namely:

$$P(N: 0\to1)=P(N=0)\times P(N=1) \quad (5)$$

The probabilities P(N=0), P(N=1), P(N: 0→1), and P(N: 1→0) are independently determined by the above-described method. In this way, all the probabilities of changes of output signals from the circuit elements 502 to 506 are determined.

Here, occurrence of a glitch in the AND gate 502 of the logic circuit shown in FIG. 5A is attributed to any one of the following conditions:

(Condition 1)

When one of the input signals $I_3$ changes from 0 to 1 while the other input signal $I_4$ changes from 1 to 0, and when a time point $T_4$ of the change of the signal $I_4$ from 1 to 0 is later than a time point $T_3$ of the change of the signal $I_3$ from 0 to 1 ($T_3<T_4$); and (Condition 2)

When one of the input signals $I_3$ changes from 1 to 0 while the other input signal $I_4$ changes from 0 to 1, and when the time point $T_3$ of the change of the signal $I_3$ from 1 to 0 is later than the time point $T_4$ of the change of the signal $I_4$ from 0 to 1 ($T_3>T_4$)

Figure 5B:
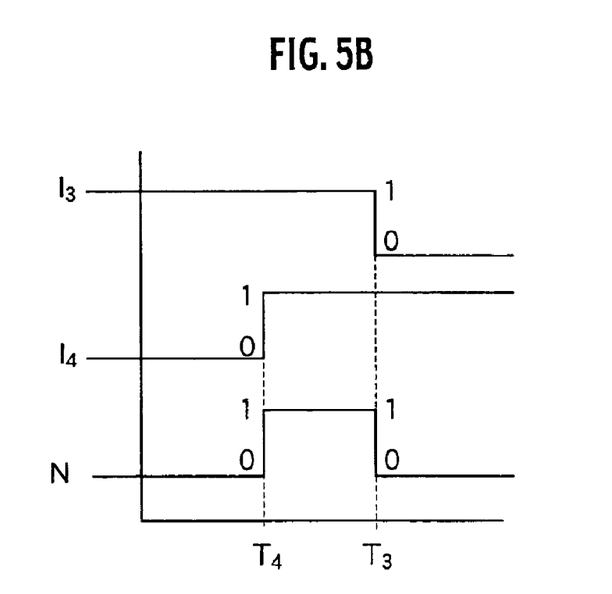
FIG. 5B is a time chart showing occurrence of a glitch within a logic circuit.

In the following, a mode of finding a probability P($I_3$: 0→1, $I_4$: 1→0, $T_3<T_4$, N: glitch) in which a glitch occurs under (Condition 1) will be described with reference to FIG. 5B. There is only one path to reach an input terminal $\alpha_2$ of the AND gate 502, which is $\alpha_3$→an inverter 505→$\alpha_2$. Meanwhile, there are three paths to reach an input terminal $\beta_2$ of the AND gate 502, which are:

$\alpha_4$→an OR gate 503→$\beta_2$;

$\alpha_6$→an inverter 506→$\alpha_5$→an AND gate 504→$\beta_4$→the OR gate 503→$\beta_2$; and $\beta_5$→the AND gate 504→$\beta_4$→the OR gate 503→$\beta_2$.

Here, a propagation delay from $\alpha_3$ to $\alpha_2$ is expressed as $\Delta(\alpha_3\to\alpha_2)$. Similarly, propagation delays in the respective paths to reach $\beta_2$ are expressed as $\Delta(\alpha_4\to\beta_2)$, $\Delta(\alpha_6\to\beta_2)$, and $\Delta(\beta_5\to\beta_2)$, respectively. The propagation delays in the respective paths can be determined based on propagation delays of signals attributable to the wiring or the circuit elements 502 to 506, and the like. Now, as a result of calculation, assumptions will be made as follows:

$$\Delta(\alpha_3\to\alpha_2)>\Delta(\alpha_4\to\beta_2) \quad (6)$$

$$\Delta(\alpha_3\to\alpha_2)<\Delta(\alpha_6\to\beta_2) \quad (7)$$

$$\Delta(\alpha_3\to\alpha_2)<\Delta(\beta_5\to\beta_2) \quad (8)$$

In this case, since $\Delta(\alpha_4\to\beta_2)$ does not satisfy the condition $T_3<T_4$, a glitch does not occur regardless of a signal change in $D_4$. On the contrary, the path "$\alpha_6$→the inverter 506→$\alpha_5$→the AND gate 504→$\beta_4$→the OR gate 503→$\beta_2$" satisfies the condition $T_3<T_4$; therefore, a glitch may occur therein. $D_4=0$ and $D_6=1$ are prerequisites in order to allow the signal $I_4$ to change from 1 to 0 in association with a change of a signal $D_5$ from 0 to 1. That is because, if $D_4=1$ or $D_6=0$, then an output signal from the OR gate 503 does not change even if the signal $D_5$ changes from 0 to 1. As a consequence, a probability P($D_5$: 0→1, $I_4$: 1→0) that the change of the signal $D_5$ from 0 to 1 causes the signal change of $I_4$ is calculated by:

$$P(D_5: 0\to1)\times P(D_4=0)\times P(D_6=1) \quad (9)$$

Moreover, if a signal $D_3$ causes a signal change from 1 to 0, then the signal $I_3$ causes a signal change from 0 to 1, whereby a glitch occurs in the output signal N from the AND gate 502. As a consequence, a probability $P(D_3, D_5, N: 0 \to 1 \to 0)$ that the glitch expressed by $0 \to 1 \to 0$ occurs in the output signal N due to the signal changes of the signals $D_3$ and $D_5$ is calculated by:

$$P(D_5: 0 \to 1) \times P(D_4 = 0) \times P(D_6 = 1) \times P(D_3: 1 \to 0) \quad (10)$$

A probability $P(D_3, D_5, N: 1 \to 0 \to 1)$ that the glitch expressed by $1 \to 0 \to 1$ occurs in the output signal N can be calculated similarly. As a result, a probability $P(D_3, D_5, N:$ glitch) that the glitch occurs in the output signal N due to the changes of the signals $D_3$ and $D_5$ is expressed as:

$$P(D_3, D_5, N: \text{glitch}) = P(D_3, D_5, N: 0 \to 1 \to 0) + P(D_3, D_5, N: 1 \to 0 \to 1) \quad (11)$$

A probability $P(D_3, D_6, N: \text{glitch})$ that the glitch occurs in the output signal N due to the changes of the signals $D_3$ and $D_6$ can be determined similarly. From these results, the probability $P(I_3: 0 \to 1, I_4: 1 \to 0, T_3 < T_4, N: \text{glitch})$, in which the glitch occurs in the output signal N under (condition 1), is equal to $P(D_3, D_5, N: \text{glitch}) + P(D_3, D_6, N: \text{glitch})$. Similarly, it is also possible to find a probability $P(I_3: 1 \to 0, I_4: 0 \to 1, T_3 > T_4, N: \text{glitch})$ that a glitch occurs in the output signal N under (Condition 2). Eventually, a probability $P(N:$ glitch) that the glitch occurs in the output signal N can be determined by adding the probabilities that the glitch occurs in the output signal N under (Condition 1) and (Condition 2) together. In this way, the probability-based glitch analyzer 83 can determine the frequency of occurrence of the glitch as a probability and thereby determine the circuit element where the glitch occurs.

The ROM 18 stores a basic input/output system (BIOS) for starting the system. The RAM 19 stores a variety of information and operation results. The circuit information storage unit 2 stores the circuit information supplied by the input device 1. The test vector information storage unit 23 stores the test vector supplied by the test vector information input device 7. The timing constraint information storage unit 14 stores the timing constraint information supplied by the timing constraint input device 6. The glitch-attributed power dissipation storage unit 9 stores the glitch-attributed power dissipation calculated by the glitch-attributed power dissipation estimation unit 8. The overall power dissipation storage unit 12 stores the overall power dissipation by the logic circuit estimated by the overall power dissipation estimation unit 11. The target skew information storage unit 24 stores the first target skew or the second target skew set by the first target skew setting unit 32a or the second target skew setting unit 32b as the first target skew or the second target skew. The latch information storage unit 25 stores positions, numbers, and the like of the first latch or the second latch insert by the first latch insertion unit 33a or the second latch insertion unit 33b. The output device 17 and the host computer 16 may provide the data which are stored in the circuit information storage unit 2, the test vector information storage unit 23, the timing constraint information storage unit 14, the glitch-attributed power dissipation storage unit 9, the overall power dissipation storage unit 12, the target skew information storage unit 24, and the latch information storage unit 25.

Figure 6:
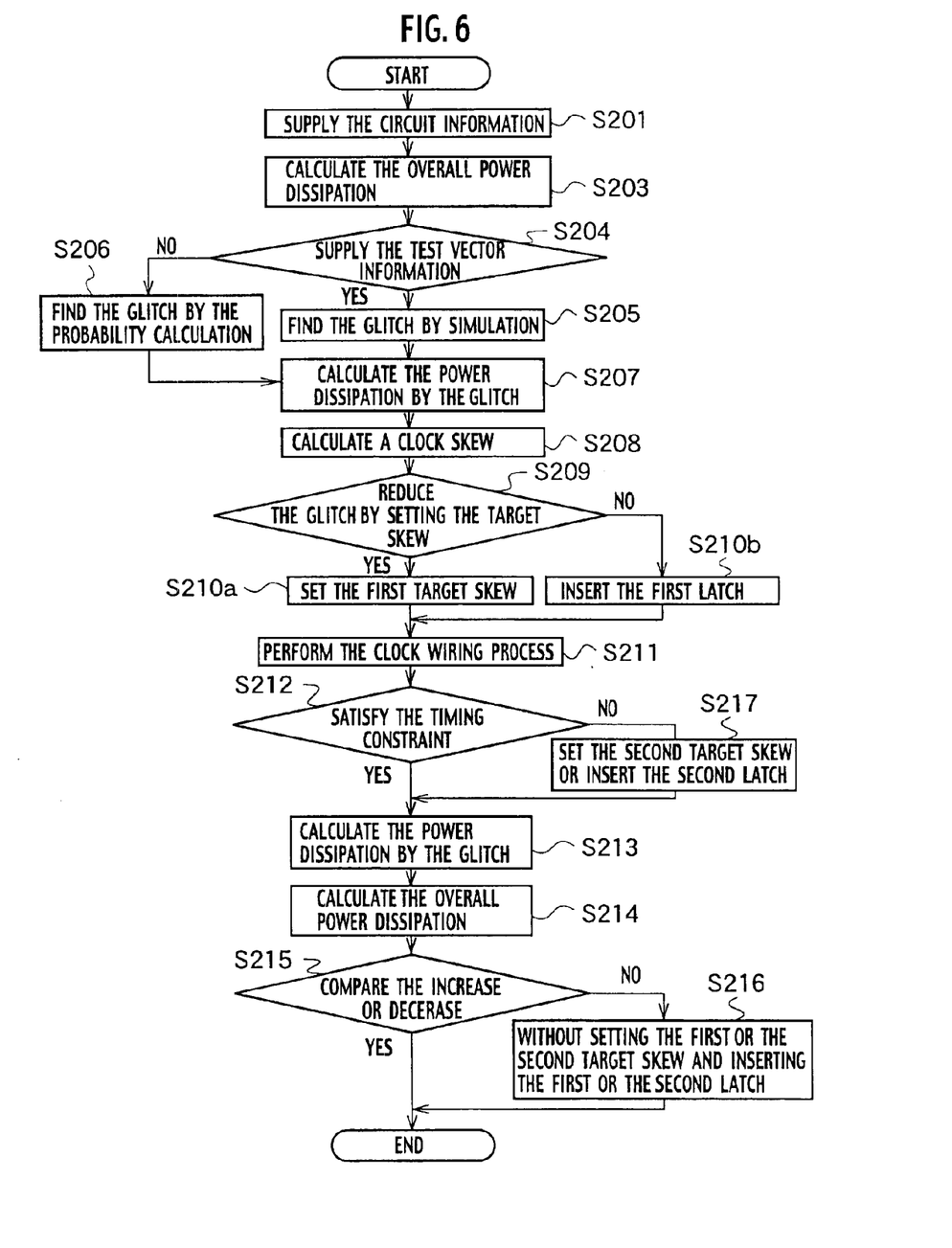
FIG. 6 is a flowchart for explaining an automatic design method according to the first embodiment of the present invention.

Next, an automatic design method according to the first embodiment will be described with reference to a flowchart of FIG. 6.

a) In Step S201, the circuit information on the logic circuit to be designed is supplied by the input device 1. In Step S203, the overall power dissipation estimation unit 11 calculates the overall power dissipation by the logic circuit which is supplied by the input device 1.

b) In Step S204, the test vector input judgment unit 81 judges whether the test vector information has been supplied by the test vector information input device 7. When the test vector information is supplied, then in Step S205, the simulation-based glitch analyzer 82 performs simulation of the logic circuit based on the test vector information while adopting information such as the propagation delays after the placement process, and thereby determines the frequency of occurrence of the glitch within the logic circuit and the circuit element where the glitch occurs. When the test vector information has not been supplied, then in Step S206, the probability-based glitch analyzer 83 performs the probability calculation, and thereby determines the frequency of occurrence of the glitch within the logic circuit and the circuit element where the glitch occurs.

c) In Step S207, the glitch-attributed power dissipation estimation unit 8 calculates the power dissipation by the glitch which occurs in the circuit element within the logic circuit which is searched by the glitch searching unit 21. In Step S208, the skew calculator 22 calculates a clock skew of the F/F which is connected to the input side of the circuit element where the glitch occurs. The clock skew calculated herein is equivalent to a value which can remove the glitch.

d) In Step S209, the circuit information analyzer 31 define the skew calculated in Step S208 as the first target skew and determines whether the glitch can be reduced by setting the skew to the signal propagation path toward the glitch-occurring circuit. In Step S210a, the first target skew setting unit 32a sets the skew to the F/F. If the circuit information analyzer 31 determines in Step S209 that the glitch cannot be reduced by setting the first target skew, then the first latch insertion unit 33a insert the first latch in the signal propagation path starting from the output side of the glitch-occurring circuit in Step S210b.

e) In Step S211, the logic circuit, after setting the first target skew by the first target skew setting unit 32a in Step S210a, or the logic circuit after insertion of the first latch by the first latch insertion unit 33a in Step S210b, is subjected to clock wiring by the clock wiring processing unit 30. In Step S212, a verification is made whether the logic circuit subjected to clock wiring satisfies the timing constraint supplied by the timing constraint input device 6. If the logic circuit is verified as not satisfying the timing constraint, then in Step S217, the second target skew is set on the clock wiring by the second target skew setting unit 32b so as to satisfy the timing constraint. In the alternative, the second latch is insert in the signal propagation path starting from the output side of the circuit element by the second latch insertion unit 33b so as to satisfy the timing constraint. In Step S213, the power dissipation by the glitch occurring in the logic circuit after setting the first target skew by the first target skew setting unit 32a in Step S210a or in the logic circuit after insert of the first latch by the first latch insert unit 22a in Step S210b is calculated by the glitch-attributed power dissipation estimation unit 8. If the logic circuit is verified as not satisfying the timing constraint, then the power dissipation by the glitch occurring in the logic circuit after further setting the second target skew by the second target skew setting unit 32b in Step S217 or in the logic circuit after insertion the second latch by the second latch insertion unit 33b is calculated by the glitch-attributed power dissipation estimation unit 8. In Step S214, the overall power dissipation of the logic circuit after setting the first or the second target skew, or the logic circuit after insert the first or the second latch is calculated by the overall power dissipation estimation unit 11.

f) In Step S215, the circuit power dissipation comparator 13 compares the increase or decrease in the glitch-attributed power dissipation calculated by the glitch-attributed power dissipation estimation unit 8 with the increase or decrease in the overall power dissipation of the logic circuit calculated by the overall power dissipation estimation unit 11 based on before and after setting the first or the second target skew and based on before and after insert the first or the second latch. If the logic circuit analysis determines that the overall power dissipation thereof has been reduced, then the automatic design method is terminated. On the contrary, when the logic circuit analysis determines that the overall power dissipation thereof is not reduced in Step S215, then in Step S216, the automatic design method is terminated without setting the first or the second target skew and insert the first or the second latch.

According to the first embodiment, when the circuit information analyzer 31 determines that the glitch can be reduced by setting the target skew, the skew is adjusted by setting the target skew and the glitch is thereby reduced. As a result, it is not necessary to insert latches to all the portions intended to reduce glitches. In this way, reduction in power dissipation is achieved while resolving the problem of the increase in the area of a semiconductor such as an LSI, attributable to insertion of the latches.

(Second Embodiment)

Figure 7:
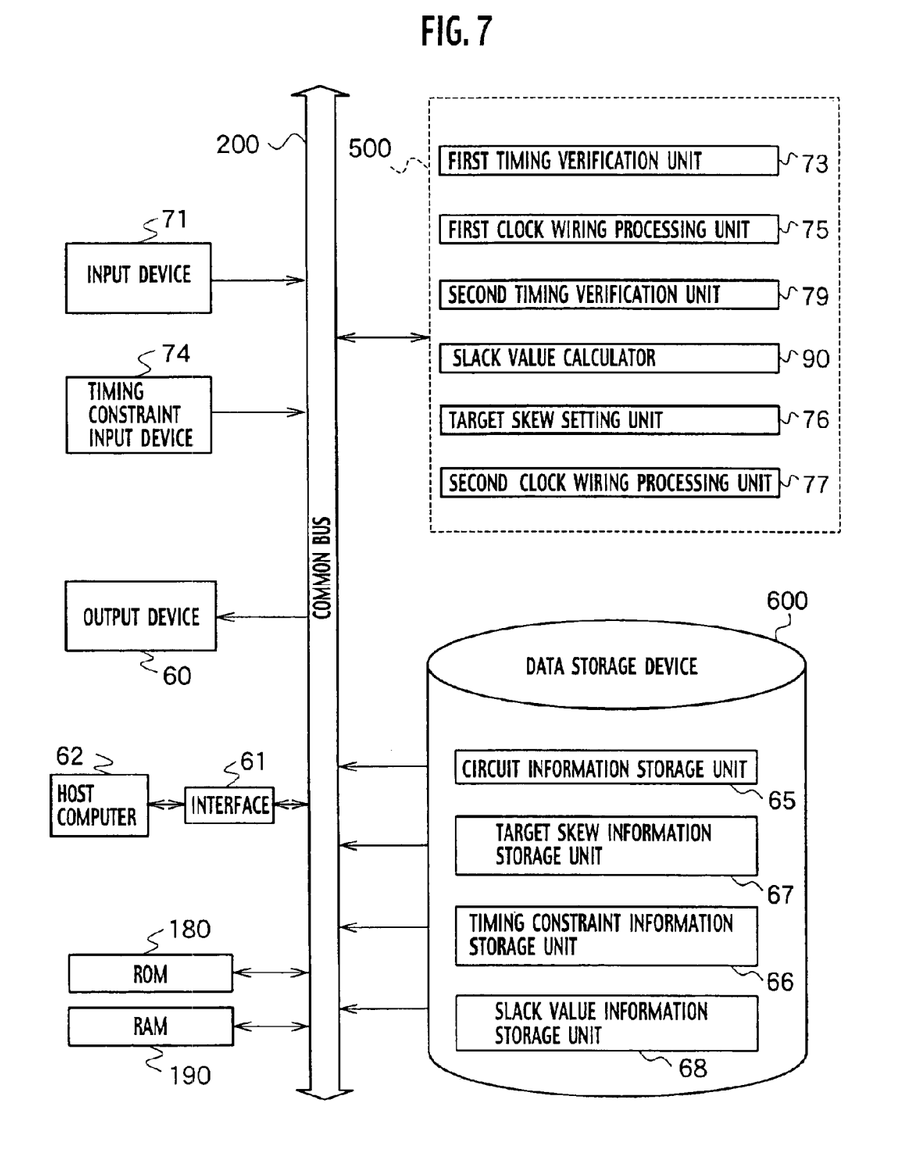
FIG. 7 is a view schematically showing an automatic design system according to a second embodiment of the present invention.

An automatic design system according to a second embodiment will be now described with reference to FIG. 7. The automatic design system includes an input device 71, a timing constraint input device 74, a CPU 500, an output device 60, an interface 61, a host computer 62, a common bus 200, a read-only memory (ROM) 180, a random access memory (RAM) 190, and a data storage device 600. The data storage device 600 includes files such as a circuit information storage unit 65, a timing constraint information storage unit 66, a target skew information storage unit 67, and a slack value information storage unit 68.

The input device 71 supplies circuit information on a logic circuit designed in accordance with the gated clock design. The timing constraint input device 74 supplies timing constraint information to be satisfied by the logic circuit designed in accordance with the gated clock design to perform designed operations. For example, the timing constraint input device 74 supplies clock cycles, clock frequencies, set-up/hold time, and the like. The output device 60 provides data to be processed by the CPU 500. The host computer 62 saves data, which are similar to the data provided from the output device 60, to a hard disk or the like through the interface 61, and provides the data to a monitor or the like which is connected to the host computer 62. The input device 71, the timing constraint input device 74, the CPU 500, the output device 60, and the interface 61 mutually exchange the data via the common bus 200.

Figure 8:
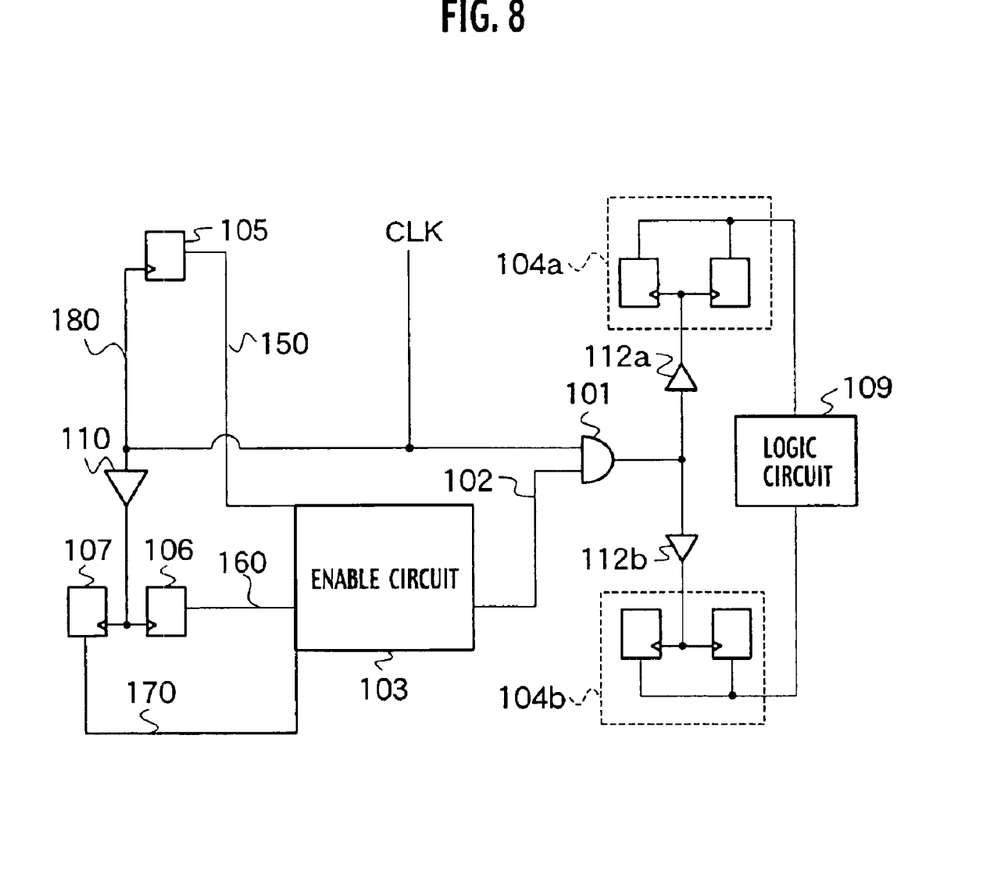
FIG. 8 is a view schematically showing the gated clock design after setting the skew.

The CPU 500 includes a first timing verification unit 73, a first clock wiring processing unit 75, a second timing verification unit 79, a slack value calculator 90, a target skew setting unit 76, and a second clock wiring processing unit 77. The first timing verification unit 73 verifies whether an enable circuit in the gated clock design supplied by the input device 71 satisfies the timing constraint supplied by the timing constraint input device 74. For example, as shown in FIG. 8, the first timing verification unit 73 verifies whether the circuit starting from the F/Fs 105 to 107 to reach the register groups 104a and 104b through the AND gate 101 satisfies the timing constraint supplied by the timing constraint input device 74. The first clock wiring processing unit 75 performs clock wiring on the logic circuit designed in accordance with the gated clock design, which is supplied by the input device 71. For example, as shown in the logic circuit designed in accordance with the gated clock design as illustrated in FIG. 8, the CTS processing is performed from the clock signal CLK to the F/Fs 105 to 107 and to the register groups 104a and 104b, and clock wiring is performed while applying the AND gate 101 as an intermediate clock buffer. The second timing verification unit 79 verifies whether the timing constraint supplied by the timing constraint input device 74 is satisfied after wiring by the first clock wiring processing unit 75. For example, when the wiring 150 is extremely longer than the wiring 160 and 170 as shown in the logic circuit designed in accordance with the gated clock design as illustrated in FIG. 8, an output signal from the F/F 105 is fed to the enable circuit 103, whereby the timing constraint supplied by the timing constraint input device 74 is not satisfied. When the second timing verification unit 79 verifies that the timing constraint is not satisfied, the slack value calculator 90 calculates the maximum slack value out of all critical paths which do not satisfy the timing constraint according to the second timing verification unit 79. For example, in the logic circuit shown in FIG. 8 which is designed in accordance with the gated clock design, the path "the F/F 105→the enable circuit 103→the wiring 102→the AND gate 101→the buffer 112a→the register group 104a", or the path "the F/F 105→the enable circuit 103→the wiring 102→the AND gate 101→the buffer 112b→the register group 104b" constitutes the critical path. The "slack value" refers to a difference between a value of the timing constraint and an actual circuit delay time value. A positive slack value means that the timing constraint is satisfied; and, a negative slack value means that the timing constraint is not satisfied. The target skew setting unit 76 sets the target skew so as to adjust the slack value calculated by the slack value calculator 90 to be positive. For example, an assumption is made herein that the slack value of the above-described critical path is $-\delta$ ($<0$) in the logic circuit designed in accordance with the gated clock design as illustrated in FIG. 8. The target skew setting unit 76 sets the target skew corresponding to $\delta$ on the F/F 105. The second clock wiring processing unit 77 performs the clock wiring processing so as to satisfy the target skew. In this event, the clock skew is adjusted by insert or deleting the buffer, or by extending or shortening the wiring. For example, in the case where the slack value of the critical path is $-\delta$ in the logic circuit designed in accordance with the gated clock design as shown in FIG. 8, it is possible to satisfy the timing constraint if a buffer on the wiring 180 is deleted so as to satisfy the target skew corresponding to $\delta$ which is set by the target skew setting unit 76.

The ROM 180 stores a basic input/output system (BIOS) for starting the system. The RAM 190 stores a variety of information and operation results. The circuit information storage unit 65 stores the circuit information supplied by the input device 71. The timing constraint information storage unit 66 stores the timing constraint information supplied by the timing constraint input device 74. The target skew information storage unit 67 stores the target skew relevant to the F/F which is set by the target skew setting unit 76. The slack value information storage unit 68 stores the maximum slack value of the critical path calculated by the slack value calculator 90. The output device 60 and the host computer 62 may supply the data which are stored in the circuit information storage unit 65, the timing constraint information storage unit 66, the target skew information storage unit 67, and the slack value information storage unit 68.

Figure 9:
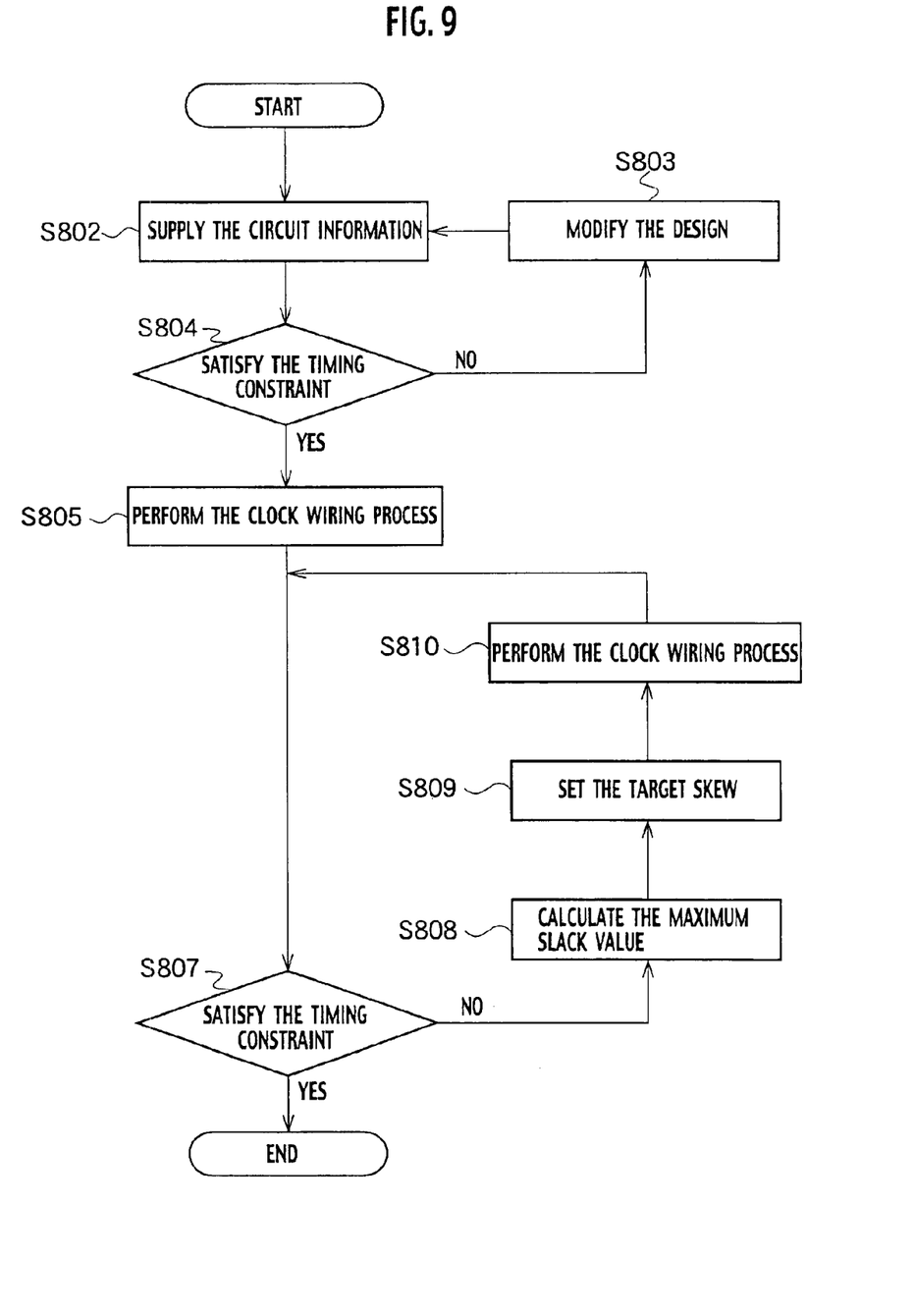
FIG. 9 is a flowchart for explaining an automatic design method according to the second embodiment of the present invention.

Next, an automatic design method according to the second embodiment will be described with reference to a flowchart of FIG. 9.

a) In Step S802, the input device 71 supplies the circuit information on the logic circuit designed in accordance with the gated clock design including the logic circuit and the enable circuit. In Step S804, the first timing verification unit 73 verifies whether the logic circuit supplied by the input device 71 satisfies the timing constraint supplied by the timing constraint input device 74. As a result of verification of the timing constraint in Step S804, if the logic circuit is verified to satisfy the timing constraint, then in Step S805, the first clock wiring processing unit 75 performs clock wiring on the logic circuit designed in accordance with the gated clock design.

b) In Step S807, the second timing verification unit 79 verifies whether the logic circuit after the clock wiring processing satisfies the timing constraint supplied by the timing constraint input device 74. As a result of the verification of the timing in Step S807, if the second timing verification unit 79 verifies that the timing constraint is not satisfied, then in Step S808, the slack value calculator 90 calculates the maximum slack value out of the critical paths which do not satisfy the timing constraint. As a result of verification, if the second timing verification unit 79 verifies that the timing constraint is satisfied, then the automatic design method is terminated.

c) In Step S809, the target skew setting unit 76 sets the slack value calculated by the slack value calculator 90 as the target skew. In Step S810, the second clock wiring processing unit 77 performs the clock wiring processing so as to satisfy the target skew. Then, back to Step S807, the second timing verification unit 79 verifies whether the timing constraint is satisfied.

d) If the first timing verification unit 73 verifies that the timing constraint is not satisfied as a result of verification in Step S804, then in Step S803, the design of the logic circuit is modified to a logic circuit designed in accordance with a gated clock design arranged to satisfy the timing constraint. In order to satisfy the timing constraint, the structure of the logic circuit may be modified, or the placement of the circuit elements may be changed.

According to the second embodiment, the clock signal to be supplied following the gated clock design is adjusted in accordance with the target skew in the step of the clock wiring process, and the timing constraint can be thereby satisfied. As a result, it is not necessary to return to the logic design step to modify the logic design so as not to use the gated clock design on the registers, and to execute the placement process again. Therefore, reduction in power dissipation is achieved in a short time period.

Various modifications will become possible for those skilled in the art after receiving the teachings of the present disclosure without departing from the scope thereof.

What is claimed is:

1. An automatic design system comprising:

an input device configured to receive circuit information on logic circuits designed by a gated clock design and being scheduled to be layouted on a large-scale integrated circuit;

a first timing verification unit configured to verify whether a timing constraint for allowing the logic circuits to operate normally is satisfied;

a first clock wiring processing unit configured to perform clock wiring on the logic circuits;

a second timing verification unit configured to verify whether the logic circuits after the clock wiring satisfies the timing constraint;

a slack value calculator configured to calculate the maximum slack value out of critical paths which do not satisfy the timing constraint when the second timing verification unit verifies that the timing constraint is not satisfied; and a target skew setting unit configured to set a target skew so as to render the slack value positive.

2. The automatic design system of claim 1, further comprising:

a second clock wiring processing unit configured to perform clock wiring after setting the target skew so as to satisfy the target skew.

* * * * *